United States Patent
Kimata et al.

(10) Patent No.: US 7,793,244 B2
(45) Date of Patent: Sep. 7, 2010

(54) TIMING ANALYSIS METHOD AND TIMING ANALYSIS APPARATUS

(75) Inventors: Atsushi Kimata, Kasugai (JP); Toshikatsu Hosono, Kasugai (JP)

(73) Assignee: Fujitsu Semiconductor Limited, Yokohama (JP)

( * ) Notice: Subject to any disclaimer, the term of this patent is extended or adjusted under 35 U.S.C. 154(b) by 0 days.

(21) Appl. No.: 11/798,338

(22) Filed: May 11, 2007

(65) Prior Publication Data

US 2007/0266357 A1   Nov. 15, 2007

(30) Foreign Application Priority Data

May 12, 2006   (JP)   ............................. 2006-133984

(51) Int. Cl.
*G06F 17/50* (2006.01)
*G06F 9/45* (2006.01)

(52) U.S. Cl. ......................................................... 716/6
(58) Field of Classification Search ...................... 716/6
See application file for complete search history.

(56) References Cited

U.S. PATENT DOCUMENTS

2004/0002844 A1* 1/2004 Jess et al. ...................... 703/14
2007/0150847 A1* 6/2007 Ikeda ........................... 716/13

FOREIGN PATENT DOCUMENTS

JP   2005-019524   1/2005

OTHER PUBLICATIONS

Lee et al.; "Refined Statistical Static Timing Analysis Through Learning Spatial Delay Correlation"; Jul. 2006; ACM; All pages.*
Agrawal et al.; "Statistical Timing Based Optimization using Gate Sizing"; 2005; IEEE, All pages.*
Amin et al.; "Statistical Static Timing Analysis: How simple can we get?"; Jun. 2005; ACM; All pages.*

* cited by examiner

*Primary Examiner*—Jack Chiang
*Assistant Examiner*—Suresh Memula
(74) *Attorney, Agent, or Firm*—Fujitsu Patent Center

(57) ABSTRACT

A signal timing analysis method for analyzing timing of a signal propagated along a path including instances. The method includes performing a delay calculation, generating files storing delay information, input slew rate, and output capacitance, performing static timing analysis (STA) based on the delay information, and generating an analysis result. The method includes calculating a delay distribution based on the input slew rate and output capacitance, a probability distribution of a delay time, a probability distribution of a transition time, and a correlation between the delay time and the transition time. The calculation of the delay distribution includes inputting an input slew rate distribution taking into consideration a correlation between output delay and transition distributions for the instance in a preceding stage. The method includes performing STA on the signal propagated along the path based on the analysis result of the STA and delay distribution.

8 Claims, 9 Drawing Sheets

TIMING ANALYSIS METHOD AND TIMING ANALYSIS APPARATUS

CROSS-REFERENCE TO RELATED APPLICATIONS

This application is based upon and claims the benefit of priority from prior Japanese Patent Application No. 2006-133984, filed on May 12, 2006, the entire contents of which are incorporated herein by reference.

BACKGROUND OF THE INVENTION

Static timing analysis (STA) is performed in the development stage of a semiconductor integrated circuit. In STA, circuit timing is analyzed and verified based on a delay assigned to each element of a digital circuit. To improve the accuracy of such delay analysis, statistical timing analysis has been employed in recent years.

In the related art, during the development of a semiconductor integrated circuit, timing analysis is performed to verify or ensure the operation of a logical circuit. During the timing analysis, a delay value for each element of the logical circuit is calculated, and a delay accumulation value for a signal transmission path is calculated based on the delay value of each element. Then, static timing analysis (STA) is performed to analyze the pulse width of a signal at an input terminal of a flip-flip circuit or a memory. The logical circuit is corrected by referring to a timing report generated based on the STA results.

Factors affecting the delay time of elements include processes for forming transistors and wires of the semiconductor integrated circuit in addition to power supply voltages and temperatures. The calculation of the delay values takes into consideration a coefficient showing on-chip variation (OCV) of each of these factors. The STA is performed using the calculated delay values to verify whether the semiconductor integrated circuit functions normally when the circuit has on-chip variation.

In the timing analysis described above, delay variations occurring in instances (cells) forming a certain path is accumulated in the order in which a signal is propagated through the path. The accumulated value is used in the timing analysis. In this case, the timing verification is performed under an extremely strict condition that would be unrealistic for an actual circuit. Thus, much time is required for timing closure. As a result, design development takes a long time.

In recent years, variations for each of these factors are handled as a statistical probability during a timing analysis (refer, for example, to Japanese Laid-Open Patent Publication No. 2005-019524). With this method, the timing verification is performed under a more moderate condition. This reduces pessimism or achieves timing closure in a relatively simple manner.

Although the analysis method described in the above publication uses cell characteristic distributions within the circuit that are extracted through, for example, Monte Carlo analysis, the analysis method does not take into consideration changes in delays that occur in accordance with the location of each element on the chip. Thus, the results of the delay analysis are not correlated with circuit timing on an actual chip. Further, the analysis method described in the above publication does not take into consideration delays resulting from characteristics unique to each cell, the input and output slew rate, and delays of the entire path formed by a plurality of cells. Accordingly, the timing analysis tends to have a low accuracy.

SUMMARY OF THE INVENTION

One aspect is a signal timing analysis method for analyzing timing of a signal propagated along a path including a plurality of instances. The method includes performing a delay calculation and generating a file storing delay information and a file storing an input slew rate and an output capacitance as a calculation result of the delay calculation and performing static timing analysis based on the delay information and generating an analysis result. The method also includes the step of calculating a delay distribution for each instance based on the input slew rate and the output capacitance stored in the file, a probability distribution of a delay time for each instance, a probability distribution of a transition time for each instance, and a correlation between the delay time and transition time. The step of calculating a delay distribution includes inputting a distribution of an input slew rate taking into consideration a correlation between an output delay distribution and an output transition distribution for the instance in a preceding stage. The method further includes performing statistical timing analysis on the signal propagated along the path based on the analysis result of the static timing analysis and the delay distribution.

A further aspect includes an apparatus for analyzing timing of a signal propagated along a path including a plurality of instances. The apparatus includes a storage device and a processor which executes program logic for performing a delay calculation, generating a file storing delay information and a file storing an input slew rate and an output capacitance as a calculation result of the delay calculation, and storing the files in the storage device. The processor further executes program logic for performing static timing analysis based on the delay information, generating an analysis result, and storing the analysis result in the storage device. The processor also executes program logic for calculating a delay distribution for each instance based on the input slew rate and the output capacitance stored in the storage device, a probability distribution of a delay time for each instance, a probability distribution of a transition time for each instance, and a correlation between the delay time and transition time. The calculation of a delay distribution includes inputting a distribution of an input slew rate taking into consideration a correlation between an output delay distribution and an output transition distribution for the instance in a preceding stage. The processor additionally executes program logic for performing statistical timing analysis on the signal propagated along the path based on the analysis result of the static timing analysis and the delay distribution.

Other aspects and advantages will become apparent from the following description, taken in conjunction with the accompanying drawings, illustrating by way of example the principles of the invention.

BRIEF DESCRIPTION OF THE DRAWINGS

The invention, together with objects and advantages thereof, may best be understood by reference to the following description of the presently preferred embodiments together with the accompanying drawings in which.

DETAILED DESCRIPTION OF THE PREFERRED EMBODIMENTS

A timing analysis apparatus and a timing analysis method according to a preferred embodiment of the present invention will now be discussed.

Figure 2:
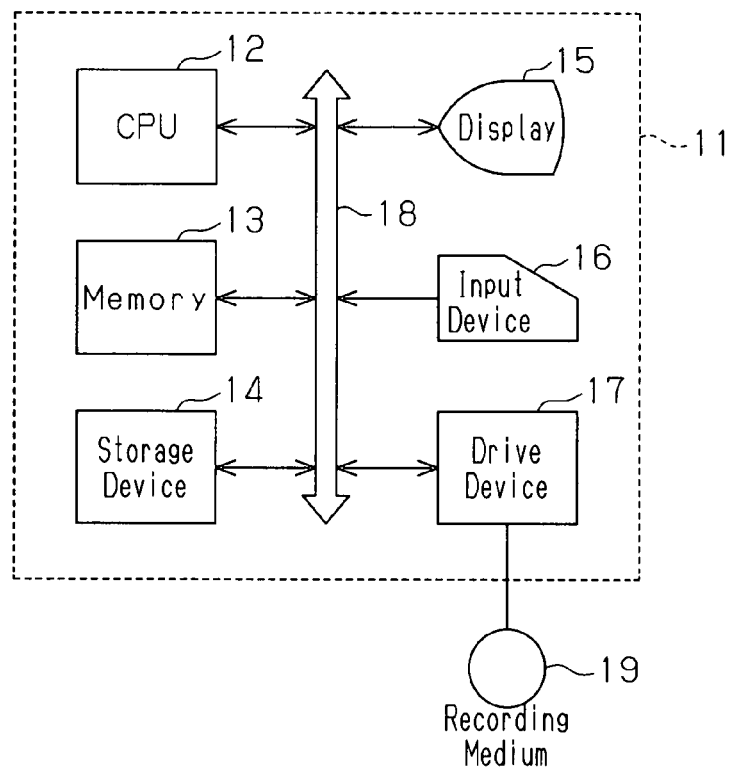
FIG. 2 is a schematic diagram showing the structure of a timing analysis apparatus.

As shown in FIG. 2, a delay analysis apparatus or a timing analysis apparatus 11 is formed by a typical computer aided design (CAD) apparatus. The timing analysis apparatus 11 includes a central processing unit (CPU) 12, a memory 13, a storage device 14, a display 15, an input device 16, and a drive device 17, which are connected to one another by a bus 18.

The CPU 12 uses the memory 13 to perform processing necessary for timing analysis according to program codes. The memory 13 stores program codes and data necessary for timing analysis. The memory 13 normally includes a cache memory, a system memory, and a display memory (not shown).

The display 15 is used to display a layout or a parameter input screen. The display 15 may be, for example, a cathode ray tube (CRT), a liquid crystal display (LCD), or a plasma display panel (PDP). The input device 16 is used by a user to input requests, instructions, and parameters. The input device 16 may be, for example, a keyboard and a mouse.

Figure 1:
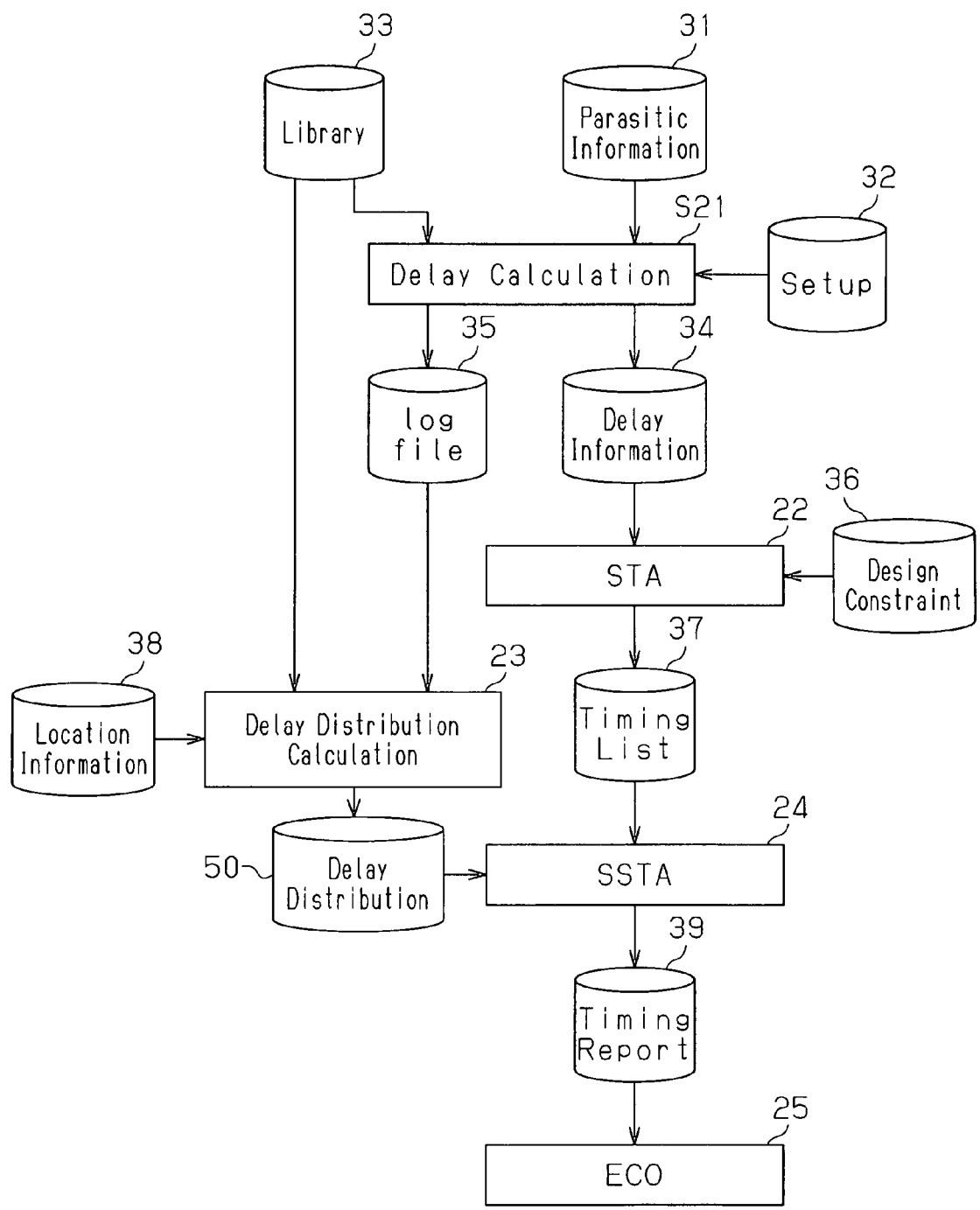
FIG. 1 is a flowchart of a delay analysis process.
Figure 3:
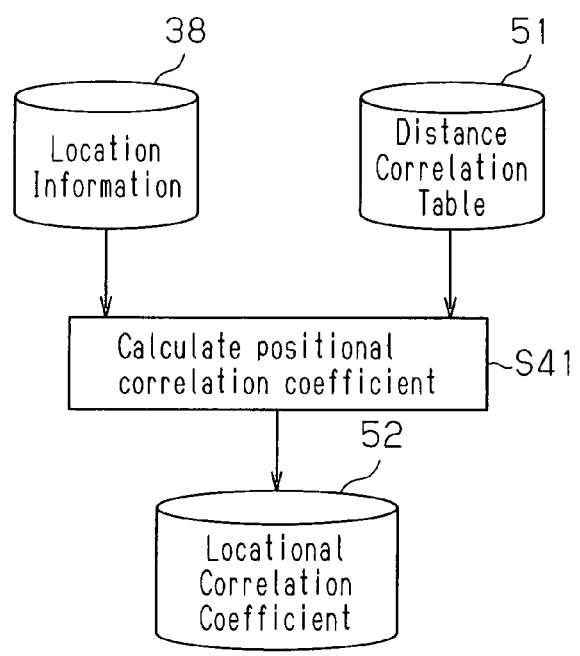
FIG. 3 is a flowchart of a parameter calculation process.
Figure 4:
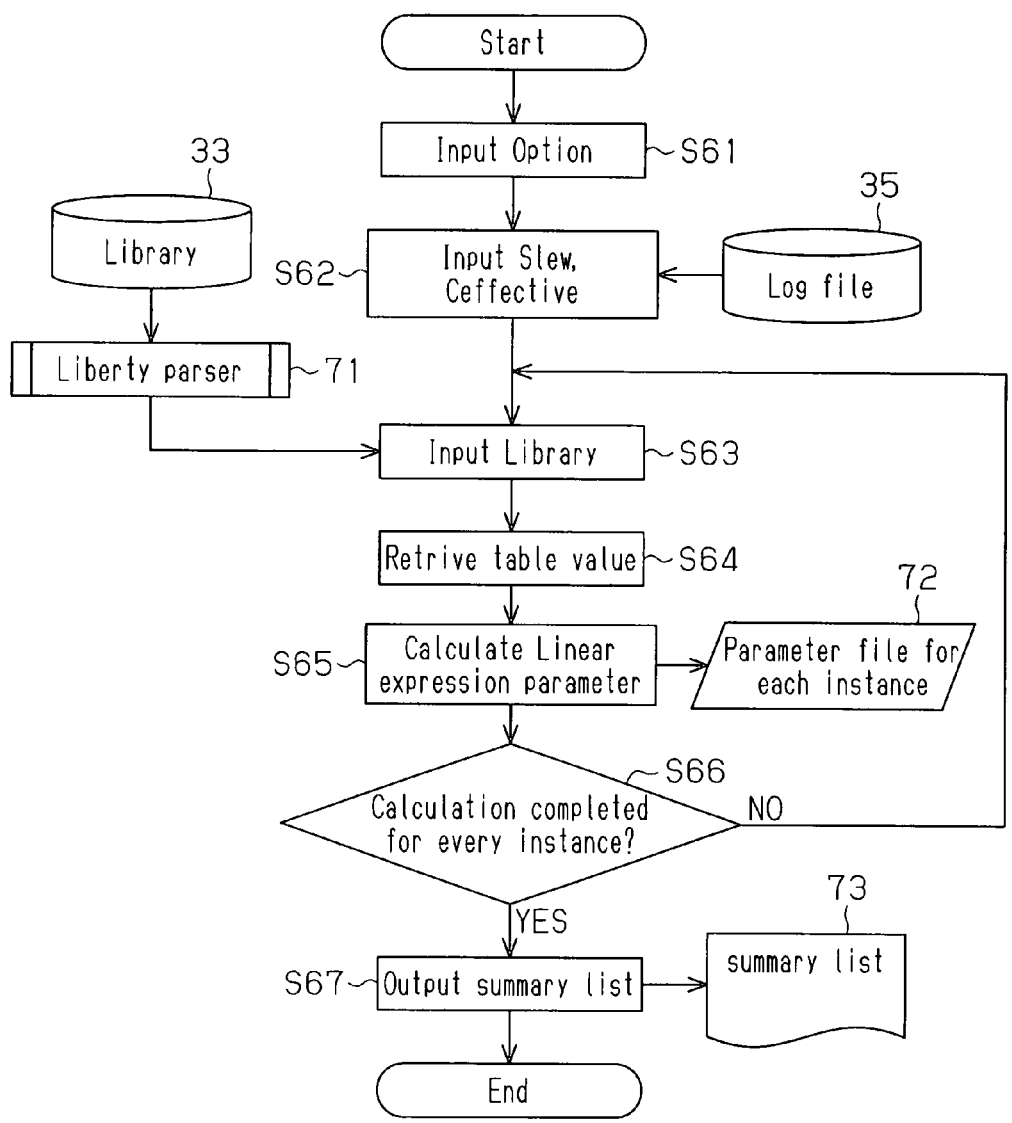
FIG. 4 is a flowchart of a parameter calculation process.

The storage device 14 may typically include a magnetic disk drive, an optical disc drive, and a magneto-optic disc drive. The storage device 14 stores program codes, data files (hereafter "files") 31 to 39 and 52, and a table 51 used to perform a timing analysis process as shown in FIGS. 1, 3, and 4. The CPU 12, which transfers program codes or data stored in a file to the memory 13 when necessary in response to an instruction from the input device 16, performs the timing analysis process. The CPU 12 reads a file necessary for the timing analysis process from the storage device 14 to generate a file or data in the storage device 14 through the timing analysis process. The storage device 14 also functions as a database.

A recording medium 19 stores program codes to be executed by the CPU 12. The drive device 17 drives and accesses the recording medium 19. The CPU 12 reads program codes from and installs program codes in the recording medium 19 via the drive device 17.

The recording medium 19 may be a computer readable recording medium selected from, for example, a memory card, a flexible disk, an optical disc (a CD-ROM, a DVD-ROM, etc.), a magneto-optic disc (an MO, an MD, etc.), a semiconductor memory, and a hard disk device. The CPU 12 may load a program code stored in the recording medium 19 into the memory 13 when necessary to perform the timing analysis process.

The recording medium 19 includes a medium or a disk unit storing program codes uploaded or downloaded via a communication medium or a storage device such as a server connected to a computer (timing analysis apparatus 11) via a communication medium. The recording medium 19 may be a recording medium storing program codes that are directly executed by a computer, a recording medium storing program codes that are executed when installed on the recording medium 19 or on another recording medium (a hard disk etc.), or a recording medium storing encrypted or compressed program codes.

FIG. 1 is a flowchart of the timing analysis process. The timing analysis process includes steps S21 to S25. The timing analysis apparatus 11 performs the timing analysis process.

In a delay calculation performed in step S21, the timing analysis apparatus 11 reads parasitic capacitance information including wire parasitic capacitance from the parasitic capacitance information file 31, reads information including on-chip variation margin from the setup file 32, and refers to the cell library 33 to extract a delay value (delay information) of each element of a target path. The timing analysis apparatus 11 then generates the file 34 including the delay information and the log file 35 including an input slew rate and an output capacitance.

During static timing analysis (STA) performed in step S22, the timing analysis apparatus 11 obtains delay information from the file 34 and design constraint information from the file 36 to perform timing analysis based on the obtained information and generate an analysis result, that is, the timing list 37.

In a delay distribution calculation performed in step S23, the timing analysis apparatus 11 obtains data showing the correlation between a delay time and a transition time (i.e., correlation coefficients shown in FIGS. 11 and 12) from the cell library 33, obtains the location information (location information file 38) showing the location of each cell on the chip, and obtains the input slew rate and the output capacitance from the log file 35, and calculates parameters for handling the locational correlation between cells, slew rate propagation, and correlation between a delay time and transition time of each cell. The location information file 38 may be, for example, layout data. As shown in FIG. 3, the timing analysis apparatus 11 calculates the locational correlation coefficient 52 based on the location information file 38 and the distance correlation table 51 (refer to FIG. 3). The locational correlation coefficient 52 is calculated in the delay distribution calculation performed in step S23. The timing analysis apparatus 11 refers to the calculated parameters and tables to calculate a delay distribution 50 corresponding to the input slew rate and the output capacitance. Slew rate variation, a correlation coefficient between the delay time and transition time of each cell, and a locational correlation coefficient 52 for the locations of the cells are incorporated to the delay distribution 50.

In step S24, the timing analysis apparatus 11 performs statistical static timing analysis (SSTA) based on the timing list 37 and the delay distribution 50. SSTA may use, for example, approximation. The timing analysis apparatus 11 generates a timing report, or the file 39, based on the SSTA result.

In the delay distribution 50 calculated in step S23 the slew rate variation of each cell and the correlation coefficient between the delay time in each cell and the transition time of the output signal are taken into consideration. Accordingly, the timing analysis performed using the delay distribution 50 in step S24 provides an analysis result having a higher accuracy than a simulation result obtained using Monte Carlo method.

In the delay distribution 50 calculated in step S23, the correlation coefficient between the locations of the cells on the chip is further taken into consideration. Accordingly, this timing analysis provides an analysis result close to characteristics of a chip even for a semiconductor chip highly dependent on cell locations. In other words, this timing analysis provides a highly accurate delay analysis result.

In a circuit correction, such as ECO (engineering change order), performed in step S25, the timing analysis apparatus 11 changes a net that requires correction based on an analysis result generated in step S25. The change performed here by the timing analysis apparatus 11 includes change of a wiring path (change of cell locations on the chip and/or addition of a buffer on the path).

As described above, this analysis handles downstream propagation of the input slew rate on the path while considering the correlation between the probability distribution of the delay time in each instance and the probability distribution of the transition time of the output signal. More specifically, this analysis analyzes the delay of the path formed by the instances while propagating the probability distribution of the waveform gradation of each instance downstream on the path. Thus, the analysis result has a high accuracy. The highly reliable timing analysis result enables circuit design or circuit change while ensuring the circuit timing quality.

FIG. 3 is a flowchart of the locational correlation coefficient calculation process included in the delay distribution calculation (step S23 in FIG. 1). The timing analysis apparatus 11 calculates a parameter for handling the locational correlation between cells in the delay distribution calculation (step S23 in FIG. 1).

The timing analysis apparatus 11 obtains the location information 38 and the distance correlation table 51. In step S41, the timing analysis apparatus 11 calculates the locational correlation coefficient 52 between instances (cell) based on the coordinates of each instance (cell) calculated from the location information 38 and the distance correlation table 51 and stores the locational correlation coefficient 52 into a locational correlation coefficient file.

FIG. 4 is a flowchart of another parameter calculation process included in the delay distribution calculation (step S23 in FIG. 1). More specifically, the timing analysis apparatus 11 calculates parameters for handing the slew rate propagation and the correlation between the delay and the transition in the delay distribution calculation of FIG. 1 (step S23).

In step S61, the timing analysis apparatus 11 obtains option data. In step S62, the timing analysis apparatus 11 obtains an instance name, a cell name, a pin name, an input slew rate (Slew), and an effective capacitance ($C_{effective}$) from the log file 35.

In step S63, the timing analysis apparatus 11 obtains library data of cells (FIGS. 17A to 17E) from the library 33 via a library parser 71. The library parser 71 converts the format of data read from the library 33 into a data format usable in step S63.

In step S64, the timing analysis apparatus 11 selects a table corresponding to the cell name and pin name from the obtained library data to extract or calculates table values from the selected table. More specifically, the timing analysis apparatus 11 extracts or calculates a mean value $\mu$ and a standard deviation $\sigma$ of each of the input slew rate and the effective capacitance and their correlation coefficient $\gamma$.

In step S65, the timing analysis apparatus 11 calculates a parameter that is an input slew rate linear expression for each instance based on the point at which the input slew rate and the effective capacitance are extracted and the table values including the mean value, the standard deviation, and the correlation coefficient. The timing analysis apparatus 11 then stores the calculated parameter into a parameter file 72 for each instance.

In step S66, the timing analysis apparatus 11 determines whether the parameter has been calculated for all of the instances. When there is an instance of which parameter has not yet been calculated, the timing analysis apparatus 11 returns to step S63. The timing analysis apparatus 11 repeats the processing from steps S63 to S65 until the parameter calculation for each one of the instances is completed. When the parameter calculation for each of the instances is completed, the timing analysis apparatus 11 proceeds to step S67.

The timing analysis apparatus 11 generates and outputs a summary list 73 in step S67. After outputting the summary list 73, the timing analysis apparatus 11 terminates the parameter calculation process.

The delay analysis process will now be described.

The delay on a path 80 (path delay) will be described with reference to FIG. 5.

The path 80 is formed by three cells (inverter circuits in FIG. 5) 83 to 85 connected in series between a terminal 81 and a cell 82. The delay on the path 80 is the time difference between the timing at which a signal A is output from the terminal 81 and the timing at which a signal B is input into the last-stage cell 82. This delay changes depending on the characteristics of the cells 83 to 85 and the locational relationship between the cells 83 to 85. In FIG. 5, graphs 91 to 93 show delay variation distributions of the cells 83 to 85, respectively. In the preferred embodiment, the path delay analysis considers the delay variation distributions 91 to 93 of the cells 83 to 85.

Figure 6:
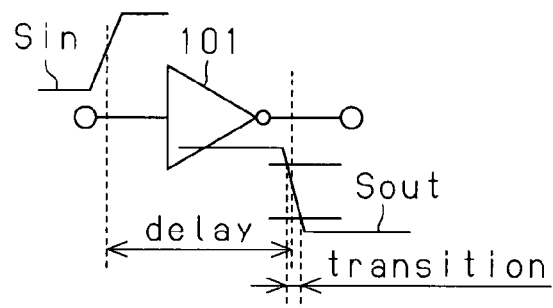
FIG. 6 is a schematic diagram describing the delay time and transition time.

A delay and a transition occurring in a cell 101 will now be described with reference to FIG. 6. In the cell 101, a delay of an output signal Sout with respect to an input signal Sin has a strong correlation with the slew rate of the input signal Sin. The transition time (transition) of the output signal Sout also has a strong correlation with the slew rate of the input signal Sin. Thus, during the calculation of the delay time in the cell 101 and the delay time distribution, the slew rate of the input signal Sin and its slew rate distribution are taken into consideration.

Figure 5:
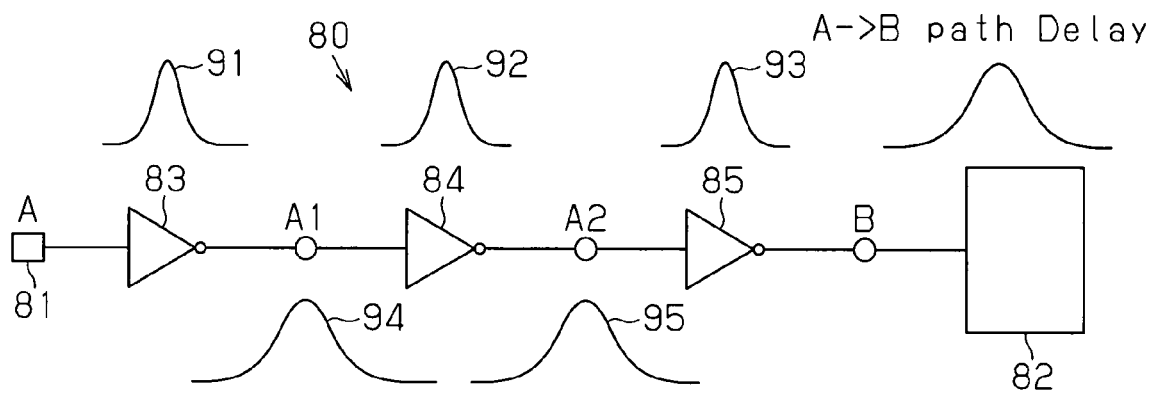
FIG. 5 is a schematic diagram of a delay analysis.

In the example of FIG. 5, when the delay in the initial-stage cell 83 varies, the transition time of an output signal A1 from the cell 83 also varies to form a distribution 94. The distribution 94 is determined by the input slew rate in the cell 83, that is, the slew rate of the signal A, and the mean value and the distribution value calculated based on the delay in the cell 83. In the same manner, a distribution 95 of the transition time of an output signal A2 in the second-stage cell 84 is determined by the input slew rate of the cell 84, that is, the transition time of the output signal A1 from the initial-stage cell 83.

Therefore, the delay time in the path 80 needs to be calculated through statistical delay analysis using the input slew rate distributions of the cells 83 to 85 (mean values (mean) and distributions (sigma)) and values representing the correlations between the delay time and the transition time of the cells 83 and 85. In other words, the calculation of the delay time in the path 80 needs to consider the propagation of the slew rate along the cells 83 to 85 of the path 80.

Moreover, the calculation of the delay on the path 80 may further need to consider layout dependency. More specifically, the calculation of the delay time in the path 80 may further need to consider whether the locations of the cells 83 to 85 or the distances between the cells 83 to 85 affect the delay variation of the path 80. In this case, the delay calculation needs to consider the locational correlations between the cells 82 to 85 of the path 80 and the input terminal 81.

Figure 7:
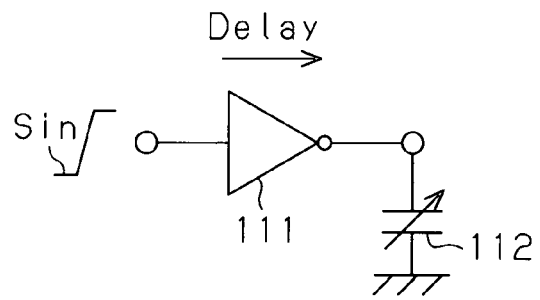
FIG. 7 is a schematic diagram describing a slew and a delay.
Figure 8A:
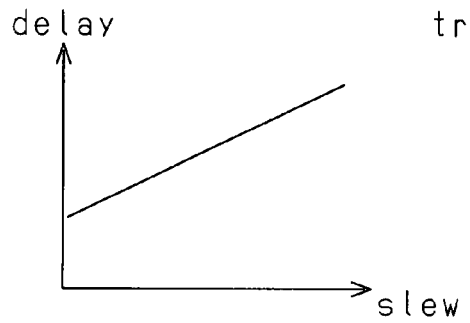
FIG. 8A is a characteristic graph showing the relationship between the slew and delay time.
Figure 8B:
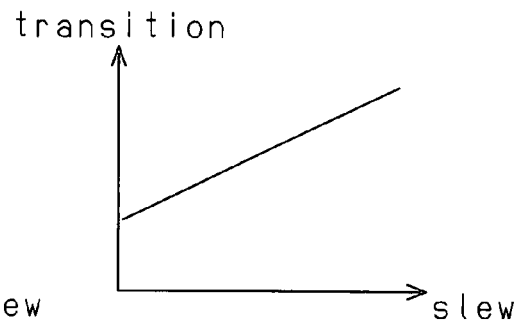
FIG. 8B is a characteristic graph showing the relationship between the slew and transition time.

In the timing analysis, the delay time of a cell 111 is calculated based on a load capacitance 112 on the cell 111 and the slew rate of an input signal Sin, as shown in FIG. 7. This is because the slew rate (slew) of the input signal Sin and the delay time (delay) of the cell 111 have a strong correlation as shown in FIG. 8A. Thus, the delay time calculation considering the slew rate of the input signal Sin is expected to increase accuracy. The path delay analysis needs to consider the transition time of the output signal in the cell 111. This is because the slew rate (slew) and the transition time (transition) of the input signal Sin have a strong correlation as shown in FIG. 8B. The path delay calculation considering the transition is expected to increase the accuracy of the calculated path delay.

The correlation between the delay time and the transition time will now be described.

The delay time and the transition time are output characteristics of one cell. Thus, the delay time and the transition time have a correlation. If the analysis does not consider this correlation, the analysis will include a large error that lowers the analysis accuracy.

Figure 9:
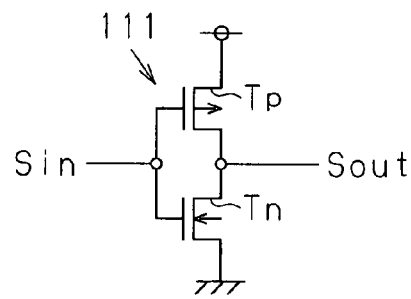
FIG. 9 is a circuit diagram showing an inverter circuit.
Figure 10A:
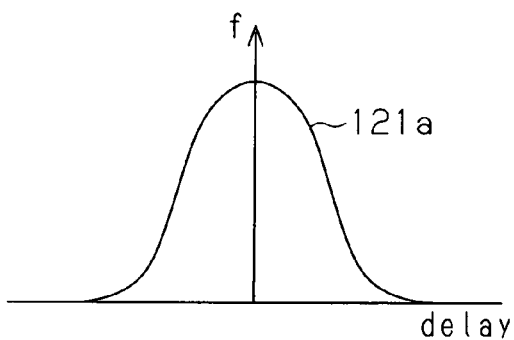
FIG. 10A is a graph showing the delay variation distribution, in which the horizontal axis represents the delay time and the vertical axis represents the probability.
Figure 10B:
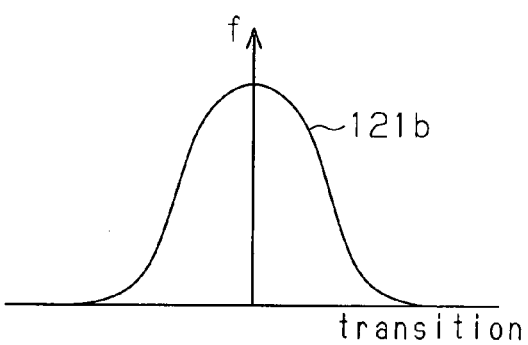
FIG. 10B is a graph showing a transition variation distribution, in which the horizontal axis represents the transition time and the vertical axis represents the probability.
Figure 11:
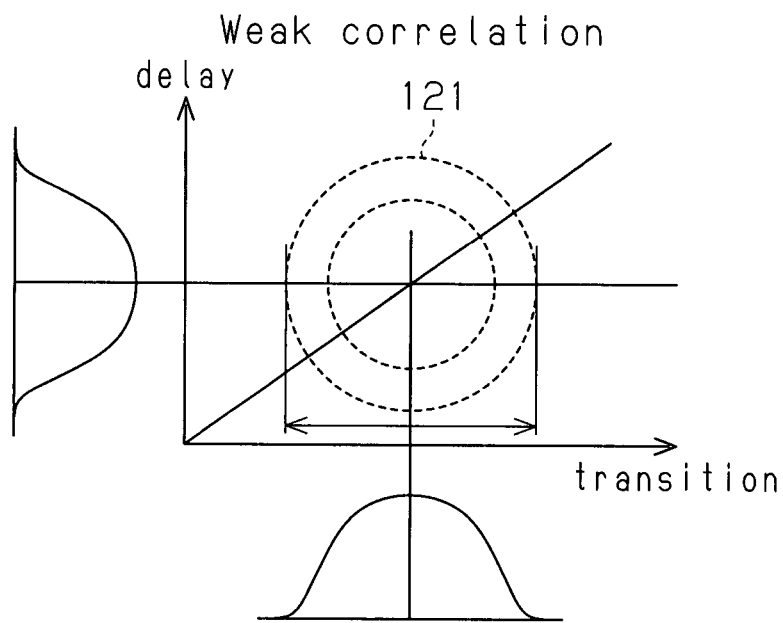
FIG. 11 is a graph showing the characteristic distribution when the delay time and transition time have a weak correlation.

The correlation between the delay time and the transition time in each cell is calculated in advance by changing the input slew rate and the output capacitance in the cell. For example, the correlation between the delay and the transition of the cell 111 (inverter circuit) shown in FIG. 7 will now be described. As shown in FIG. 9, the cell 111 is formed by a P-channel MOS (metal oxide semiconductor) transistor Tp and an N-channel MOS (metal oxide semiconductor) transistor Tn. The distributions of the delay time and the transition time when the output signal Sout rises are calculated by changing the gate length and the threshold voltage Vth of each of the transistors Tp and Tn. FIG. 11 shows one example of the calculation result. FIG. 11 shows a correlation distribution 121 between the delay time and the transition time. The distribution 121 is obtained based on a delay distribution 121a shown in FIG. 10A and a transition distribution 121b shown in FIG. 10B.

Figure 12:
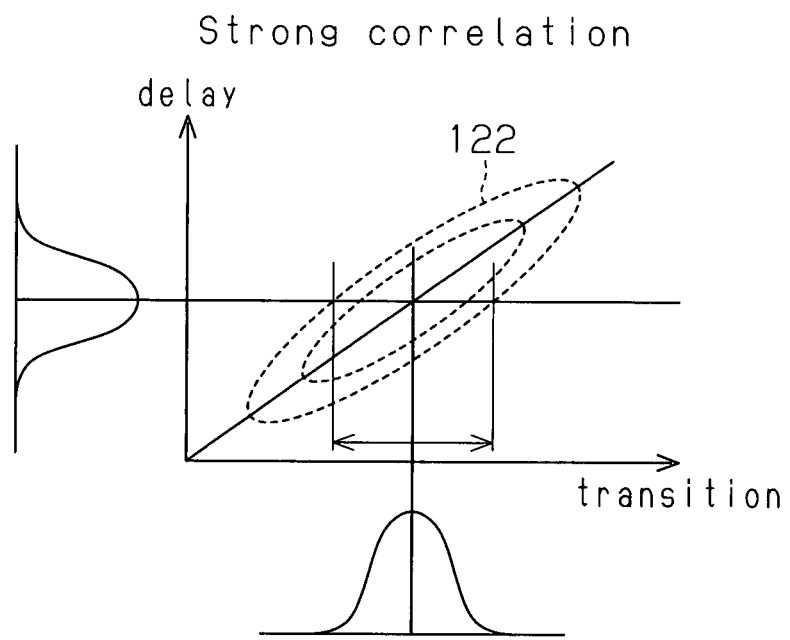
FIG. 12 is a graph showing the characteristic distribution when the delay time and transition time have a strong correlation.

For example, when the cell is formed by a large number of circuit stages, the distribution 121 shown in FIG. 11 is obtained. When the cell is formed by a small number of circuit stages, a distribution 122 shown in FIG. 12 is obtained. The distribution 121 shown in FIG. 11 has a narrower width than the distribution 122 shown in FIG. 12. This means that the distribution 122 shown in FIG. 12 has a stronger correlation between the transition time and the delay time than the distribution 121 shown in FIG. 11. In this way, the distribution of the correlated transition and delay differs depending on the cell structure. The distribution of the correlated transition and delay in each cell is calculated in advance and the calculated distribution of each cell is stored in, for example, the library 33.

The locational correlation of cells will now be described.

Figure 13:
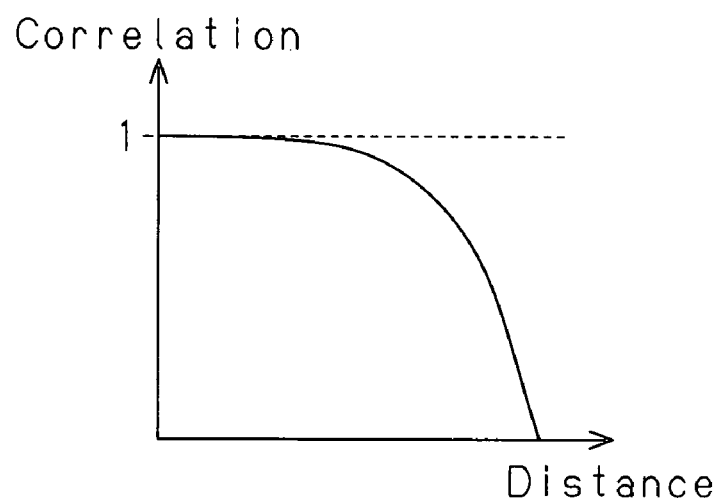
FIG. 13 is a graph showing the relationship between distance and correlation coefficient.
Figure 14:
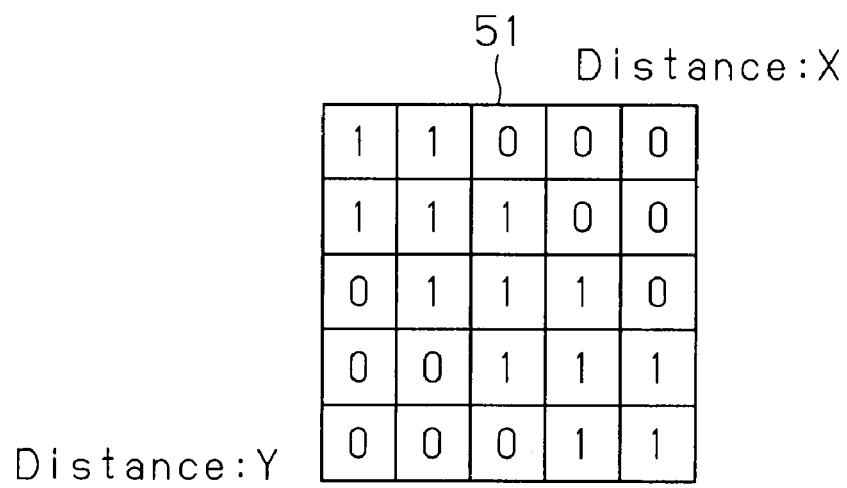
FIG. 14 is a distance-correlation table.

As shown in FIG. 13, the correlation between cells within a chip (inter-cell correlation) is physically known to change depending on the distance between the cells (cell distance). As shown in FIG. 14, a matrix table (distance correlation table) 51 that corresponds to the distance between two orthogonal axes stores the relationship between the inter-cell correlation and the cell distance. The table 51 is used to calculate a variation amount in the delay analysis.

Next, the extraction of values from the library will be described.

Figure 15A:
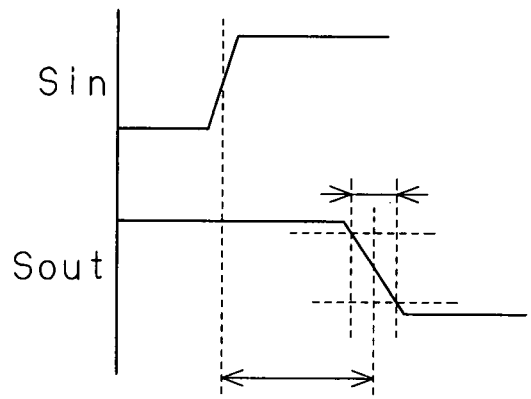
FIGS. 15A and 15B are schematic diagrams of a fall characteristic and a rise characteristic, respectively.
Figure 15B:
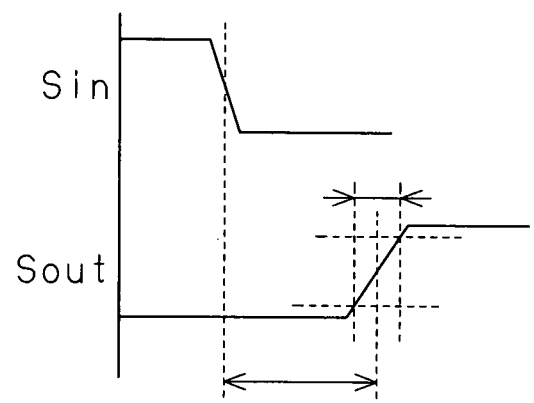

For example, the cell 111 and the load capacitance 112 shown in FIG. 7 have input and output characteristics including a fall characteristic (FIG. 15A) of the output signal Sout with respect to the rise of the input signal Sin and a rise characteristic (FIG. 15B) of the output signal Sout with respect to the fall of the input signal Sin. For each of the fall and rise characteristics, a distribution mean value $\mu$, a standard deviation $\sigma$, and a correlation coefficient $\gamma$ are calculated using the expressions shown below. In each of these expressions, n is the number of times by which a process variation (including the gate length L and the threshold voltage Vth) is changed in a target cell.

$$\mu = \frac{1}{n}\sum_{i=1}^{n} x_i \quad \text{Expression 1}$$

$$\sigma = \sqrt{\frac{1}{n}\sum_{i=1}^{n}(x_i - \bar{x})^2} \quad \text{Expression 2}$$

$$\gamma = \frac{\sum_{i=1}^{n}(x_i - \bar{x})(y_i - \bar{y})}{\sqrt{\left(\sum_{i=1}^{n}(x_i - \bar{x})^2\right) \times \left(\sum_{i=1}^{n}(y_i - \bar{y})^2\right)}} \quad \text{Expression 3}$$

Figure 17A:
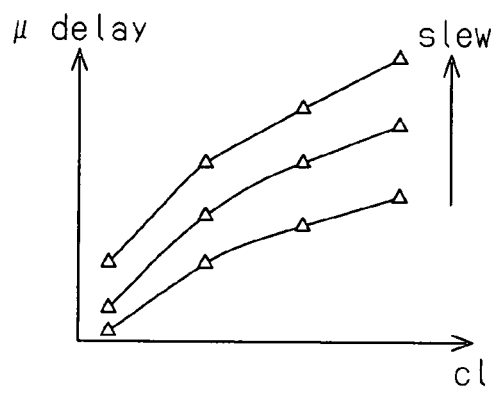
FIGS. 17A to 17E are schematic diagrams describing distributions.
Figure 17B:
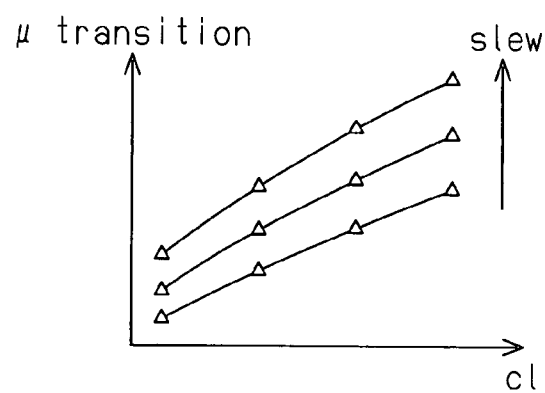
Figure 17C:
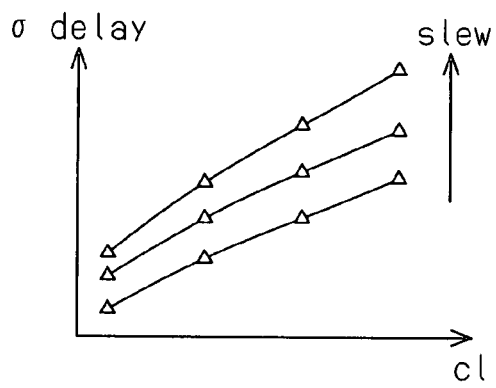
Figure 17D:
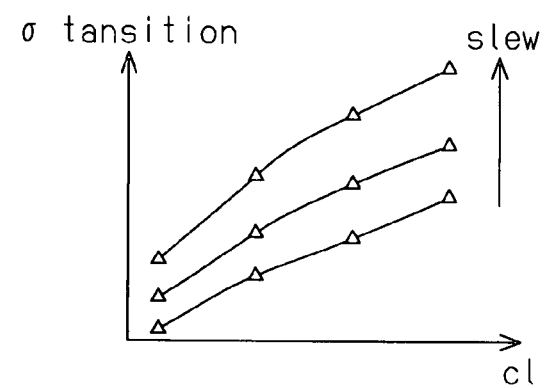
Figure 17E:
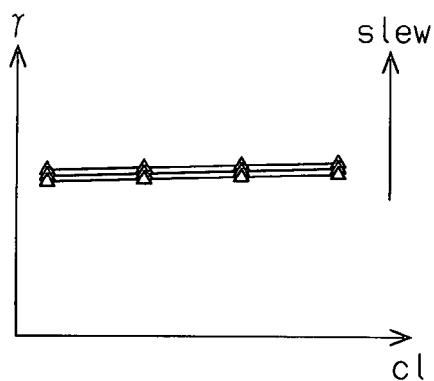

FIG. 17A shows the relationship between the mean value $\mu$ and the output capacitance cl of the calculated delay time distribution. FIG. 17B shows the relationship between the mean value $\mu$ and the output capacitance cl of the calculated transition time distribution. FIG. 17C shows the relationship between the standard deviation $\sigma$ of and the output capacitance cl of the calculated delay time distribution. FIG. 17D shows the relationship between the standard deviation $\sigma$ and the output capacitance cl of the calculated transition time distribution. FIG. 17E shows the relationship between the correlation coefficient $\gamma$ and the output capacitance cl of the calculated delay distribution. The tables shown in FIGS. 17A to 17E are stored in the library data.

A calculation method used in the statistical static timing analysis (SSTA) performed in step S24 of FIG. 1 will now be described.

The probability distribution of the delay and the probability distribution of the transition are both modeled as linear approximate functions with respect to the input slew rate.

First, a parameter that is a function (coefficient with respect to the input slew rate) modeled using a linear approximation is calculated. A delay time probability distribution d is represented by the next expression.

$$d = (A*s\_in + B)*(a*r1 + b*r2) + (C*s\_in + D)$$

A transition time probability distribution s is represented by the next expression.

$$s=(P*s\_in+Q)*(b*r1+a*r2)+(R*s\_in+S)$$

In the above expressions, parameters A and B are output delay standard deviation coefficients with respect to the input slew rate (s_in), parameters C and D are output delay mean coefficients with respect to the input slew rate, parameters P and Q are output slew rate standard deviation coefficients with respect to the input slew rate, parameters R and S are output slew rate mean coefficients with respect to the input slew rate, and r1 and r2 are probability functions independent of each other with a mean value of zero and a standard deviation of 1, and parameters a and b are represented by the next expressions.

$$a=(\text{sqrt}(1+\rho)+\text{sqrt}(1-\rho))/2$$

$$b=(\text{sqrt}(1+\rho)-\text{sqrt}(1-\rho))/2$$

In the above expressions, ρ is represented by the next expression.

$$\rho=K*s\_in+L$$

In the above expression, parameters K and L are correlation coefficients between the delay time and the output slew rate in each cell with respect to the input slew rate.

Then, the standard deviation σ_d of the delay in each cell is calculated by applying the parameters and the mean value (mean) and the standard deviation (sigma) of the input slew rate to the next expression.

$$(\sigma\_d)^2=(A*\sigma s\_in)^2+(C*\sigma s\_in)^2+(A*\mu s\_in+B)^2+2*C*\sigma d\_in*\sigma s\_in*\rho\_in$$

In the above expression, μs_in is the mean value of the input slew rate, σs_in is the standard deviation of the input slew rate, σd_in is the standard deviation of the delay time, and ρ_in is the correlation coefficient between the input slew rate and the delay time. In the above expression, ^2 indicates a square.

To perform calculation for the following stage cell in the path, the correlation coefficient ρ_ot between the total delay and the output slew rate is calculated using the next expressions.

$$\sigma\_ot=\text{cov}(d,s\_ot)/(\sigma d*\sigma s\_ot);$$

$$\text{cov}(d,s\_ot)=A*P*(K*\mu s\_in+L)*(\sigma s\_in^2)+(A*Q+B*P+2*A*P*\mu s\_in)*K*(\sigma s\_in^2)+(A*\mu s\_in+B)*(P*\mu s\_in+Q)*(K*\mu s\_in+L)+C*R*(\sigma s\_in^2)+\rho\_in*R*\sigma s\_in*\sigma d\_in;$$

$$(\sigma s\_ot)^2=(P*\sigma s\_in)^2+(R*\sigma s\_in)^2+(P*\mu s\_in+Q)^2,$$

where cov(d,s_ot) is the covariance in the cell.

Then, the statistical delay analysis is performed by carrying out a convolution calculation.

The above calculation method applied to cells 131 to 133 forming a path 130 shown in FIG. 16 will now be described.

A signal is propagated in the path 130. When d represents the delay time of the signal from a source from which the signal is propagated to a node N1 between the cell 131 and the cell 132, the da and db respectively represent the delay times of the cells 132 and 133. In this case, when the calculation simply considers the delay times in the cells 132 and 133, d+da represents the delay time up to a node N2 between the cell 133 and the cell 133. As a result, a delay at a node N3 at an output terminal side of the cell 133 is represented by (d+da)+db.

First, a correlation coefficient between the delay time up to the cell 132 and the delay time da in the cell 132 is calculated.

A variation model function of the delay d at the node N1 and the delay da occurring in the cell 132 is represented by the next expressions.

$$d=m(d)+A1*r1+B1*r$$

$$da=m(da)+A2*r2+B2*r$$

Here, m(d) represents the mean value of d; m(da) represents the mean value of da; A1, A2, B1, and B2 represent sensitivity coefficients; r1 represents the random variation element of d (with a mean of 0 and a distribution of 1); r2 represents the random variation element of da (with a mean of 0 and a distribution of 1); r represents the correlation variation element of both d and da (with a mean of 0 and a distribution of 1); and r, r1, and r2 represent probability functions independent of one another.

The standard deviation σ(d) of the delay d, the standard deviation σ(da) of the delay da, and the correlation function ρ(d,da) of the delays d and da are represented by the next expressions.

$$\sigma(d)=\text{sqrt}(A1^2+B1^2)$$

$$\sigma(da)=\text{sqrt}(A2^2+B2^2)$$

$$\rho(d,da)=B1*B2/(\sigma(d)*\sigma(da))$$

Figure 16:
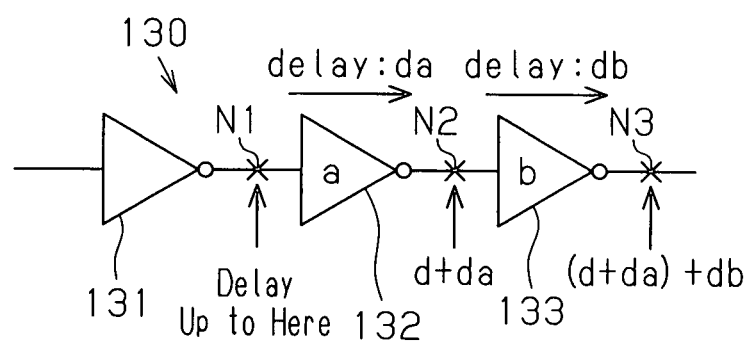
FIG. 16 is a schematic diagram describing delay calculation considering locational correlations.

As a result, the delay time (d+da) at the node N1 in FIG. 16 is represented by the next expression.

$$d+da=m(d)+m(da)+A1*r1+A2*r2+(B1+B2)*r.$$

The mean value of the delay (d+da) is represented by the next expression.

$$m(d+da)=m(d)+m(da)$$

The standard deviation σ(d+da) of the delay (d+da) is represented by the next expression.

$$\sigma(d+da)^2 = A1^2 + A2^2 + (B1+B2)^2$$
$$= A1^2 + B1^2 + A2^2 + B2^2 + 2*B1*B2$$
$$= \sigma(d)^2 + \sigma(da)^2 + 2*\sigma(d)*\sigma(da)*\rho(d,da)$$

In the above expression, 2*σ(d)*σ(da)*ρ(d,da) represents an increase in variation due to locational correlations.

Then, the correlation coefficient of the delay time up to the cell 133 and the delay time db in the cell 133 in FIG. 16 is calculated. The correlation coefficient is calculated in the same manner as described above. Thus, the covariance cov(d+da,db) in the cell 133 is represented by the next expression.

$$\text{cov}(d+da,db)=\text{cov}(d,db)+\text{cov}(da,db)$$

The correlation coefficient ρ(d+da,db) in the cell 133 is represented by the next expression.

$$\rho(d+da,db) = \text{cov}(d+da,db)/(\sigma(d+da)*\sigma(db))$$
$$= (\sigma(d)/\sigma(d+da))*\rho(d,db) +$$
$$(\sigma(da)/\sigma(d+da))*\rho(da,db).$$

In the above description, the delay analysis is performed on cells formed by inverter circuits. However, the delay analysis may be performed in the same manner on cells formed by other various types of circuits, such as AND circuits and NAND circuits. Further, the same delay analysis may also be performed on cells formed by a plurality of cells, e.g. macro cells.

The preferred embodiment has the advantages described below.

(1) The timing analysis apparatus 11 calculates the delay distribution of each instance based on the input slew rate, the output capacitance, and the correlation between the delay time and the transition time of each cell. When calculating the delay distribution, the timing analysis apparatus 11 handles propagation of the slew rate distribution by obtaining the input slew rate distribution considering the correlation between the output delay distribution and the output transition distribution of the preceding stage. This improves the accuracy of the delay distribution analysis.

(2) The timing analysis apparatus 11 calculates parameters for each instance based on the input slew rate and the output capacitance and the correlation coefficient of the mean values and the standard deviations of the delay time and transition time that are obtained from the library data in order to calculate the delay distribution using predetermined expressions for calculations based on the obtained parameters. This enables the timing analysis apparatus 11 to obtain the delay distribution within a short time without requiring simulation or the like to be performed.

(3) The probability distributions d and s of the delay and the transition are calculated based on the input slew rate in each instance. Thus, the calculated probability distributions of the delay and the transition each have a strong correlation with the input slew rate.

(4) The timing analysis apparatus 11 calculates the locational correlation coefficient 52 considering the distance between instances forming one path and the locations of each instance based on the location information 38 of each instance and the distance correlation table 51 corresponding to the distance between the instances. In step S23 in which the delay distribution 50 is calculated, the timing analysis apparatus 11 calculates the delay distribution 50 by adding the locational correlation coefficient 52 to the variation amount in the delay analysis. The distance between the instances within the chip has a correlation with the delay time. Thus, by calculating the delay distribution according to the location of each instance, the delay analysis is performed in a manner suitable for an actual chip. This improves the accuracy of the delay analysis.

The expressions used for the calculations in the above embodiment may be modified in any manner.

It should be apparent to those skilled in the art that the present invention may be embodied in many other specific forms without departing from the spirit or scope of the invention. Therefore, the present examples and embodiments are to be considered as illustrative and not restrictive, and the invention is not to be limited to the details given herein, but may be modified within the scope and equivalence of the appended claims.

What is claimed is:

1. A signal timing analysis method for analyzing timing of a signal propagated along a path including a plurality of instances, the method comprising:
performing, via a computer system, a delay calculation;
generating a file storing delay information and a file storing an input slew rate and an output capacitance as a calculation result of the delay calculation;
performing static timing analysis based on the delay information and generating an analysis result;
calculating a delay distribution for each instance based on the input slew rate and the output capacitance stored in the file, a probability distribution of a delay time for each instance, a probability distribution of a transition time of an output signal for each instance, and a correlation between the delay time and the transition time of the output signal, wherein the calculating a delay distribution for an instance includes inputting a distribution of an input slew rate for a preceding-stage instance taking into consideration a correlation between an output delay distribution and an output transition distribution for the preceding-stage instance; and
performing statistical timing analysis on the signal propagated along the path based on the analysis result of the static timing analysis and the delay distribution.

2. The method according to claim 1, wherein the of calculating a delay distribution includes:
obtaining the input slew rate and the output capacitance from the file;
calculating, based on library data, an input slew rate and an output capacitance, a mean value and standard deviation of a delay time distribution, a mean value and standard deviation of a transition time distribution, and a correlation coefficient between a delay time and transition time of an output signal for each instance; and
calculating for each instance a parameter of a predetermined expression based on the correlation coefficient and generating a file including the parameter.

3. The method according to claim 1, wherein the probability distribution of a delay time and the probability distribution of a transition time of the output signal are calculated based on the input slew rate for each instance.

4. The method according to claim 1, further comprising:
calculating a locational correlation coefficient taking into consideration the distance between the instances the location of each instance based on location information of each instance of the path and a distance correlation table corresponding to the distance between the instances; and
wherein the calculating a delay distribution includes adding the locational correlation coefficient to a variation amount of the delay analysis.

5. A signal timing analysis apparatus for analyzing timing of a signal propagated along a path including a plurality of instances, the apparatus comprising:
a storage device; and
a processor which executes program logic stored on a computer-readable medium, which causes the processor to execute operations including:
performing a delay calculation, generating a file storing delay information and a file storing an input slew rate and an output capacitance as a calculation result of the delay calculation, and storing the files in the storage device;
performing static timing analysis based on the delay information, generating an analysis result, and storing the analysis result in the storage device;
calculating a delay distribution for each instance based on the input slew rate and the output capacitance stored in the storage device, a probability distribution of a delay time for each instance, a probability distribution of a transition time of an output signal for each instance, and a correlation between the delay time and transition time of the output signal, wherein said calculating a delay distribution for an instance includes inputting a distribution of an input slew rate for a preceding-stage instance taking into consideration a correlation between an output delay distribution and an output transition distribution for the preceding-stage instance; and performing statistical timing analysis on the signal propagated along the path based on the analysis result of the static timing analysis and the delay distribution.

6. The apparatus according to claim 5, wherein execution of the program logic further causes the processor to:

obtain the input slew rate and the output capacitance from the storage device;

calculate, based on library data, an input slew rate and an output capacitance, a mean value and standard deviation of a delay time distribution, a mean value and standard deviation of a transition time distribution, and a correlation coefficient between a delay time and transition time of an output signal; and calculate for each instance a parameter of a predetermined expression based on the correlation coefficient and generates a file including the parameter to calculate the delay distribution.

7. The apparatus according to claim 5, wherein the probability distribution of a delay time and the probability distribution of the transition time of the output signal are calculated based on the input slew rate for each instance and stored in the storage device.

8. The apparatus according to claim 5, wherein execution of the program logic further causes the processor to:

calculate a locational correlation coefficient taking into consideration the distance between the instances and the location of each instance based on location information of each instance of the path and a distance correlation table corresponding to the distance between the instances; and add the locational correlation coefficient to a variation amount of the delay analysis to calculate the delay distribution.

* * * * *